US009448274B2

(12) United States Patent
Pounds et al.

(10) Patent No.: US 9,448,274 B2
(45) Date of Patent: Sep. 20, 2016

(54) CIRCUITRY TO PROTECT A TEST INSTRUMENT

(71) Applicant: Teradyne, Inc., North Reading, MA (US)

(72) Inventors: Douglas W. Pounds, Goffstown, NH (US); Charles J. Carline, Londonderry, NH (US)

(73) Assignee: Teradyne, Inc., North Reading, MA (US)

( * ) Notice: Subject to any disclaimer, the term of this patent is extended or adjusted under 35 U.S.C. 154(b) by 187 days.

(21) Appl. No.: 14/254,363

(22) Filed: Apr. 16, 2014

(65) Prior Publication Data

US 2015/0301104 A1   Oct. 22, 2015

(51) Int. Cl.
  *G01N 27/416* (2006.01)
  *G01R 31/28* (2006.01)
  *G01R 1/20* (2006.01)

(52) U.S. Cl.
  CPC .............. *G01R 31/28* (2013.01); *G01R 1/20* (2013.01)

(58) Field of Classification Search
  CPC .... G01R 31/28; G01R 31/002; G01R 31/02; G01R 1/20
  See application file for complete search history.

(56) References Cited

U.S. PATENT DOCUMENTS

| | | | |
|---|---|---|---|
| 4,639,604 A * | 1/1987 | Murakami | G01B 11/02 250/548 |
| 5,233,241 A * | 8/1993 | Nishimori | H03K 19/1736 326/38 |
| 5,739,700 A * | 4/1998 | Martin | H03K 19/018521 326/17 |
| 5,767,708 A | 6/1998 | Groeneveld et al. | |
| 5,864,458 A | 1/1999 | Duffy et al. | |
| 6,104,583 A * | 8/2000 | Wynn | H02H 3/025 361/106 |
| 6,411,458 B1 * | 6/2002 | Billings | G11B 27/36 360/25 |
| 6,452,436 B1 | 9/2002 | Leip | |
| 7,149,098 B1 | 12/2006 | Chen | |
| 7,330,342 B2 * | 2/2008 | Bald | G01R 31/3278 361/93.1 |
| 7,395,479 B2 * | 7/2008 | Gohel | G01R 1/36 714/703 |
| 7,848,074 B2 | 12/2010 | Stiedl | |
| 8,072,342 B2 * | 12/2011 | Huang | H02H 3/08 324/424 |
| 8,502,549 B2 * | 8/2013 | Kojima | G01R 31/31924 324/750.01 |
| 2006/0161827 A1 | 7/2006 | Gohel et al. | |
| 2006/0176797 A1 * | 8/2006 | Chekcheyev | G11B 7/0053 369/59.19 |
| 2009/0219055 A1 * | 9/2009 | Kurokawa | H02M 3/157 327/3 |
| 2011/0264973 A1 * | 10/2011 | Ma | G01R 31/2843 714/736 |
| 2012/0050922 A1 * | 3/2012 | Yamai | H02P 29/022 361/31 |
| 2012/0218675 A1 * | 8/2012 | Morrish | H02H 9/025 361/111 |

OTHER PUBLICATIONS

International Search Report and Written Opinion mailed Jun. 30, 2015 in international application No. PCT/US2015/025531, 14 pgs.

* cited by examiner

*Primary Examiner* — Tung X Nguyen
*Assistant Examiner* — Dominic Hawkins
(74) *Attorney, Agent, or Firm* — Choate, Hall & Stewart LLP

(57) ABSTRACT

Controlling a test instrument may include: determining a first value corresponding to power output by the test instrument; determining a second value based on the first value, where the second value corresponds to an amount of energy consumed by the test instrument; and placing at least part of the test instrument in a high-impedance state when the second value exceeds a threshold.

18 Claims, 4 Drawing Sheets

CIRCUITRY TO PROTECT A TEST INSTRUMENT

TECHNICAL FIELD

This specification relates generally to circuitry to protect a test instrument.

BACKGROUND

Automatic Test Equipment (ATE) refers to an automated, usually computer-driven, system for testing devices, such as semiconductors, electronic circuits, and printed circuit board assemblies. A device tested by ATE is generally referred to as a device under test (DUT). ATE typically includes a computer system and a test instrument or a single device having corresponding functionality. ATE is capable of providing test signals to a DUT, receiving response signals from the DUT, and forwarding those response signals for processing to determine whether the DUT meets testing qualifications. In some cases, the test instrument is capable of providing power to the DUT during testing.

SUMMARY

An example method of controlling a test instrument may comprise: determining a first value corresponding to power output by the test instrument; determining a second value based on the first value, where the second value corresponds to an amount of energy consumed by the test instrument; and placing at least part of the test instrument in a high-impedance state when the second value exceeds a threshold. The example method may include one or more of the following features, either alone or in combination.

Determining the first value may comprise obtaining a product of an input voltage value and a voltage corresponding to an input current value and, based on the product, producing an output voltage corresponding to the first value. Determining the second value may comprise: generating an output current based on the output voltage; and integrating the output current over time to produce the second value.

The example method may further comprise: comparing the second value to the threshold; and outputting a comparison value based on the comparison. The test instrument may be placed in the high-impedance state by a latch in response to receipt of the comparison value. The latch may output a control signal to place the test instrument in the high-impedance state.

The threshold may be a first threshold. The example method may further comprise: following placement of the test instrument into the high-impedance state, lowering the power output by the test instrument so that the output current is less than a fixed current; performing a reverse integration over time based on the fixed current to produce a third value; comparing the third value to the second threshold; and placing at least part of the test instrument in an operational state when, based on the comparing, the third value exceeds the second threshold. Comparing the third value to the second threshold may result in a second comparison value. The test instrument may be returned to the normal operational state by a resetting of the latch in response to receipt of the second comparison value. The latch may output a control signal to place the test instrument in the operational state.

Following placing at least part of the test instrument in a high-impedance state, the test instrument may be controlled manually or programmatically to place the test instrument into an operational state.

The input voltage may be based on a voltage across terminals of a power field-effect transistor. The input current may be based on voltage across terminals of a sense resistor. A multiplier circuit may be used to determine the first value corresponding to an output voltage. The voltage may be output to a resistor to produce a current that exceeds a fixed current. The second value may be obtained by integrating the current over time.

The test instrument may comprise multiple channels. The following operations of the example method may be performed for a channel in the test instrument: determining the first value, determining the second value, and placing the test instrument in the high-impedance state. The example method may include causing the test instrument to exit the high-impedance state following a decrease in the power output by the test instrument.

Example circuitry to control a test instrument may comprise: a multiplier circuit to receive an input voltage and a voltage corresponding to an input current and to provide an output voltage; an integrator circuit to output an integrated voltage based on a current corresponding to the output voltage; a comparator circuit to perform a comparison of the integrated voltage to a threshold, and to output a result signal based on the comparison; and a latch to output a control signal to the test instrument based on the result signal. The example circuitry may include one or more of the following features, either alone or in combination.

A resistor may be configured to receive the output voltage. The current may correspond to the output voltage passing through the first resistor as a result of the output voltage received by the resistor. In an example, the resistor is a first resistor, the current corresponding to the output voltage is a first current, the integrated voltage is a first integrated voltage, the threshold is a first threshold, and the control signal is a first control signal. The circuitry may further comprise: a second resistor connected to a voltage source, and a second current passing through the second resistor. In a case that the second current is greater than the first current, the integrator is configured to output a second integrated voltage based on the second current. The comparator circuit may be configured to perform a comparison of the second integrated voltage to a second threshold, and to output a second result signal based on the comparison. The latch may be configured to output a second control signal to the test instrument based on the second result signal.

The first control signal may be to put at least part of the test instrument into a high-impedance state, and the second control signal may be to put the at least part of the test instrument into an operational mode. The at least part of the test instrument is a single channel of the test instrument.

The example circuitry may comprise: a power field-effect transistor across which a voltage corresponding to the input voltage is measured; and a resistor through which a current corresponding to the input current is measured. The example circuitry may comprise: a power stage to output power from the instrument to a device under test. The power stage may be configured to receive, and to respond to, the control signal. The integrator may comprise an operational amplifier.

Example circuitry to control a test instrument may comprise: an integrator circuit to output an integrated voltage based on a current corresponding primarily to either (i) a fixed voltage or (ii) an output power of the test instrument; a comparator circuit to perform a comparison of the integrated voltage to a threshold, and to output a result signal based on the comparison; and a latch to output a control signal to the test instrument based on the result signal. The control signal may be to put at least part of the test instrument in a high-impedance state if the current corresponds to an output power of the test instrument. The control signal may be to put the test instrument in an operational mode if the current corresponds to the fixed voltage.

Any two or more of the features described in this specification, including in this summary section, can be combined to form implementations not specifically described herein.

The test systems and techniques described herein, or portions thereof, can be implemented as/controlled by a computer program product that includes instructions that are stored on one or more non-transitory machine-readable storage media, and that are executable on one or more processing devices to control (e.g., coordinate) the operations described herein. The test systems and techniques described herein, or portions thereof, can be implemented as an apparatus, method, or electronic system that can include one or more processing devices and memory to store executable instructions to implement various operations.

The details of one or more implementations are set forth in the accompanying drawings and the description below. Other features and advantages will be apparent from the description and drawings, and from the claims.

DESCRIPTION OF THE DRAWINGS

Like reference numerals in different figures indicate like elements.

DETAILED DESCRIPTION

Manufacturers may test devices at various stages of manufacturing. In an example manufacturing process, integrated circuits are fabricated in large quantities on a single silicon wafer. The wafer is cut into individual integrated circuits called dice. Each die is loaded into a frame, and bonding wires are attached to connect the die to leads that extend from the frame. The loaded frame is then encapsulated in plastic or another packaging material to produce a finished product.

Manufacturers have an economic incentive to detect and discard faulty components as early as possible in the manufacturing process. Accordingly, many manufacturers test integrated circuits at the wafer level, before a wafer is cut into dice. Defective circuits are marked and generally discarded prior to packaging, thus saving the cost of packaging defective dice. As a final check, many manufacturers test each finished product before it is shipped. Such a process tests parts in packages which have had additional expense added to them over bare die. So, having accurate test results reduces the need to discard valuable parts.

To test quantities of components, manufacturers commonly use ATE (or "testers"). In response to instructions in a test program set (TPS), some ATE automatically generates input signals to be applied to a device under test (DUT), and monitors output signals. The ATE compares the output signals with expected responses to determine whether the DUT is defective. ATE typically includes a computer system and a test instrument or a single device having corresponding functionalities. In some cases, the test instrument provides power to a DUT. High power, however, can damage the test instrument. For example, high amounts of power drawn by a DUT can cause the test instrument to overheat, resulting in damage to the test instrument. In this regard, amounts of power that may cause damage to a test instrument may vary from instrument to instrument.

Accordingly, described herein are examples of circuitry for protecting a test instrument from exposure to high power. Although the circuitry is described in the context of a test instrument, the circuitry may be used with any type of electronics or hardware that may benefit from protection from damage caused by high power.

Figure 1:
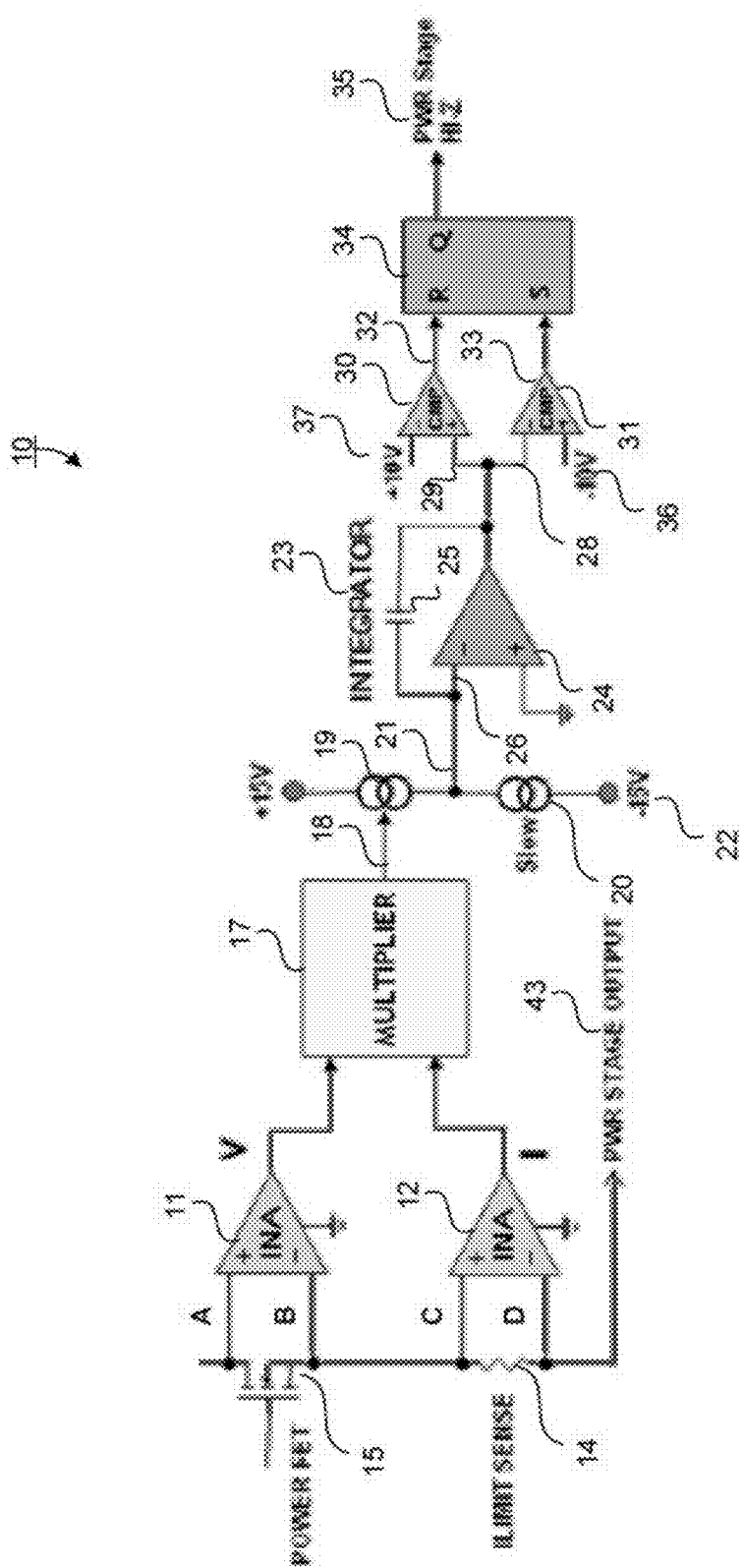
FIG. 1 shows an example of circuitry for protecting a test instrument.

An example of circuitry 10 for protecting a test instrument is shown in FIG. 1. Circuitry 10 includes amplifiers 11 and 12. Amplifier 12 senses current through a test instrument by sensing voltage, which is a function of current, across resistance 14. Amplifier 11 senses the voltage in the test instrument by sensing the voltage across terminals of a power field effect transistor (FET) 15.

Amplifier 11 outputs a voltage value V and amplifier 12 outputs a voltage proportional to a current value I. A multiplier circuit 17 multiplies the two voltages to obtain an output value 18 that corresponds to the product of V and I, and thus to the power output of the test instrument. In this regard, the power output corresponds to the amount of power drawn by a DUT through one of multiple channels of the test instrument. By determining the power output, it is possible to determine the amount of energy consumed by the instrument and, thus, the amount of heat dissipation in the instrument (which correspond to the energy). A value corresponding to the energy may be used to control operation of the test instrument so that the test instrument does not overheat. As described below, in example implementations, the value (or values) corresponding to the energy is used in placing at least part of the test instrument into a high-impedance state, or in placing at least part of the test instrument in an operational state.

More specifically, in circuitry 10, the output value 18 of multiplier circuit 17 corresponds to the power output in the test instrument. That output value 18 has a voltage component that is applied to a voltage controlled current source. In the example implementation of FIG. 1, the current source is the multiplier 17's output voltage across a resistor 19; however, other types of current sources may be used. As shown, the current source is connected in series with another current source, which may be a voltage across a resistor 20.

In the example implementation of FIG. 1, resistor 19 is connected to a positive voltage source (e.g., −15V) and resistor 20 is connected to a negative voltage source (e.g., −15V); however, in other implementations, the voltage connections and values may be different. In response to an output voltage from multiplier circuit 17 (e.g., the voltage component of the output power), the voltage at resistor 19 increases, thereby increasing the amount of current through resistor 19, and towards, and through, circuit path 21. The more output voltage there is, the larger is the amount of current through resistor 19, and towards, and through, circuit path 21. Conversely, the less output voltage there is, the smaller is the amount of current through resistor 19, and towards, and through, circuit path 21.

At some point, which is dependent on the parameters of the components of circuitry 10 (e.g., voltages resistances, and so forth), the output voltage is small enough so that current through resistor 20 is the controlling factor in the operation of circuitry 10. For example, if the output voltage from multiplier circuit 17 is zero, rather than current flowing towards, and through, circuit path 21, current flows in the reverse direction, e.g., from circuit path 21 and through resistor 20 towards negative voltage source 22. The direction of current flow through circuit path 21 dictates whether an integration performed by integrator 23 is positive or negative.

In this example implementation, integrator 23 includes an amplifier 24 and a feedback capacitor 25, although other types of integrators may be used. When current flows towards, and through, circuit path 21 (that is, into capacitor 25 of integrator 23), integrator 23 generates and outputs an integrated voltage based on a current through resistor 19 corresponding to the output voltage of multiplier circuit 17. Since these values correspond to power output in the test instrument, the resulting integrated value corresponds to energy consumed by, and thus heat dissipation in, the test instrument. The integrated value is output to terminals 28 and 29 of comparators 30 and 31, respectively, as shown in FIG. 1.

In this example implementation, comparator 30 compares its input at terminal 28 to a first voltage value (+10V) and comparator 31 compares its input at terminal 29 to a second voltage value (−10V). In other implementations, the connections and/or values may be different. The outputs 32 and 33 of respective comparators 30 and 31 control a latch 34. As described in more detail below, latch 34 is configured to, output a control signal 35 in response to the signal from integrator 23, to place the test instrument in a high-impedance state or in an operational state.

More specifically, in this example implementation, integrator 23 is configured to produce a negative voltage ramp in response to positive current through capacitor 25 and a positive voltage ramp in response to negative current through capacitor 25. In other implementations, integrator 23 may be configured to produce different values in response to positive and negative currents. Accordingly, as power output increases, the amount of positive current through capacitor 25 (e.g., current towards, and through, circuit path 21) increases, resulting in an increasing negative voltage ramp. At some point, the negative voltage exceeds reference voltage 36 of comparator 31, resulting in an output that controls latch 34 to place the test instrument in a high-impedance state. Stated otherwise, as the power output in the test instrument exceeds a certain value for a certain amount of time, the result is that integrator 23 outputs a voltage that exceeds reference voltage 36, which causes latch 34 to place the test instrument in a high-impedance state. The high-impedance state may mean that the test instrument is non-operational, that current is prevented from passing therethrough, or that current through the test instrument is low (e.g., zero or below some value). Other implementations may use different definitions for the high-impedance state.

In this example implementation, in the high-impedance state, current through the test instrument is low (e.g., zero or below some value). Accordingly, the voltage component output of multiplier circuit 17 is low (e.g., zero or below some value), resulting in current flowing in the reverse direction from terminal 26, e.g., from circuit path 21 and through resistor 20 towards negative voltage source 22. In other words, the current at terminal 26 is negative (since current is flowing out of amplifier 24). As a result, integrator 23 performs a reverse integration, which produces a positive voltage ramp at the output of integrator 23. Accordingly, as power output in the test instrument decreases in the high-impedance state, the amount of negative current at terminal 26 (e.g., current from circuit path 21) increases, resulting in an increasing positive voltage ramp. At some point, the positive voltage exceeds reference voltage 37 of comparator 30, resulting in an output that controls latch 34 to exit the test instrument from the high-impedance state, and to place the test instrument in an operational state. Stated otherwise, as the power output in the test instrument decreases for a certain amount of time, the result is that integrator 23 outputs a voltage that exceeds reference voltage 37, which causes latch 34 to place the test instrument in its operational state.

In some implementations, the test instrument may include multiple channels. Each channel may include a communication path, through which a corresponding DUT is tested. In some implementations, each channel may include circuitry, such as that shown in FIG. 2 to protect the test instrument. Accordingly, in some implementations, a DUT on a single channel causing undue power output may result in the whole test instrument being placed in a high-impedance state. In some implementations, a DUT on a single channel causing undue power output may result in only that channel being placed in a high-impedance state. Thus, the following may be performed for a channel in the test instrument: determining a value corresponding to power output in the test instrument, determining a value corresponding to an integrated current corresponding to the power output, and placing the test instrument in a high-impedance state or an operational state.

To summarize, in some implementations, the multiplier circuit output will proportionally control an integration current to an integrator circuit. When the integrator reaches a specific threshold related to a fixed amount of energy used internal to the test instrument, a comparator circuit will place the test instrument into a high impedance state to reduce the internal power to a value, e.g., almost to zero. At this point, in some implementations, the integrator will change direction and integrate more slowly at a fixed rate until another threshold is reached where the test instrument will be able to resume normal operation. The maximum energy absorbed by the test instrument may be automatically limited by setting the integration currents and thresholds in a manner to duty cycle control the test instrument. In some implementations, the reverse integration may not occur to cause the test instrument to resume normal operation. Rather, user or programmatic intervention may be used to cause the test instrument to resume normal operation.

Figure 2:
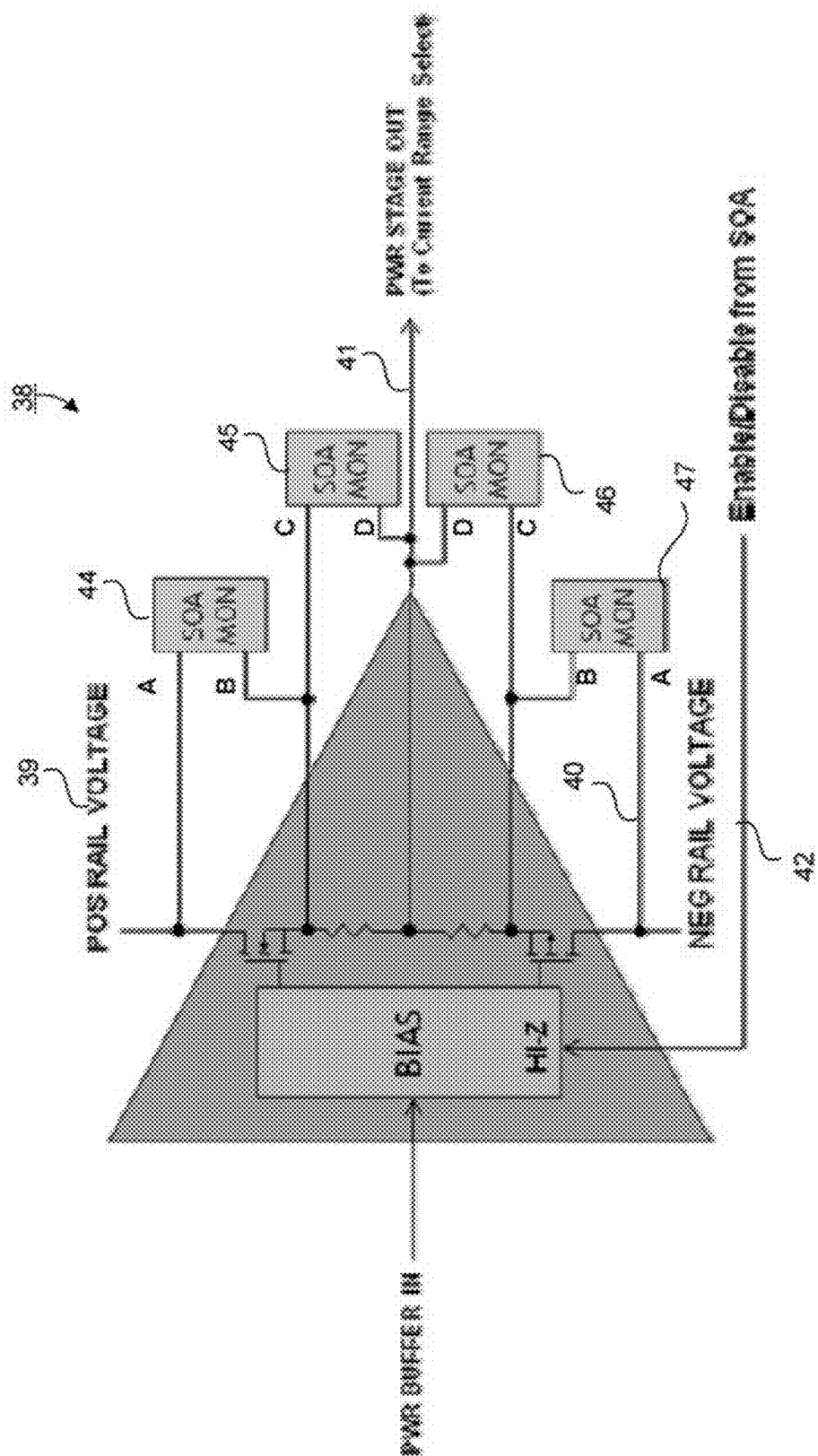
FIG. 2 shows an example channel of the test instrument.

The example circuitry of FIG. 1 may be used to protect a four-quadrant test instrument, such as that shown in FIG. 2. In the example of FIG. 2, a channel 38 connects to a positive voltage rail 39 and to a negative voltage rail 40, and is capable of sourcing positive voltage and sourcing or sinking current, or sourcing negative voltage and sourcing or sinking current. The resulting power output 41 is shown. Enable/disable signal 42 corresponds to the output of latch 34, and places channel 38 in high-impedance (HI-Z) state or causes channel 38 to exit the high-impedance state, and resume normal operations. Output 41 of FIG. 2 corresponds to "PWR STAGE OUTPUT" 43 of FIG. 1. In FIG. 2, components 44 through 47 correspond to inputs to circuitry such as that shown in FIG. 1. In FIGS. 1 and 2, corresponding terminals are commonly labeled as A, B, C, and D to indicate which terminals of FIG. 1 correspond to which terminals of FIG. 2.

Thus, in some implementations, the circuitry described herein will automatically monitor the voltage and current usage internal to the test instrument over time and, if the voltage and current usage moves close to a critical energy threshold, the circuitry circuit will force the test instrument into a safe, e.g., high-impedance, state for a period of time to allow the test instrument to cool down. Use of the circuitry may reduce the need for a user to manually manage power usage in the test instrument.

Figure 3:
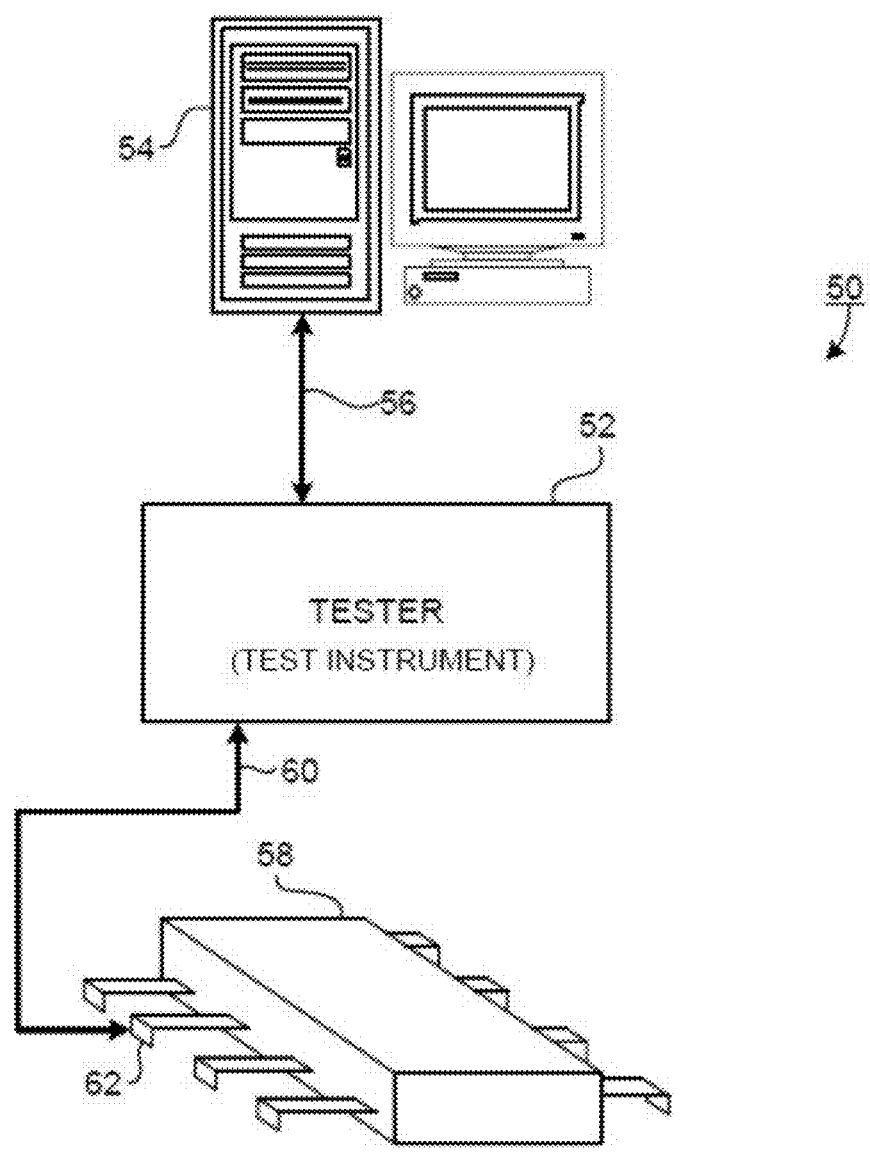
FIG. 3 shows an example implementation of the test instrument.

Referring to FIG. 3, an example ATE system 50 for testing a DUT 58, such as a semiconductor device, includes a tester (or "test instrument") 52. Tester 52 may include a number of channels, each of which may include the circuitry of FIGS. 1 and 2, or variations thereof. To control tester 52, system 50 includes a computer system 54 that interfaces with tester 52 over a hardwire connection 56. In an example operation, computer system 54 sends commands to tester 52 to initiate execution of routines and functions for testing DUT 58. Such executing test routines may initiate the generation and transmission of test signals to the DUT 58 and collect responses from the DUT. Various types of DUTs may be tested by system 50. For example, DUTs may be semiconductor devices such as an integrated circuit (IC) chip (e.g., memory chip, microprocessor, analog-to-digital converter, digital-to-analog converter, etc.) or other devices.

To provide test signals and collect responses from the DUT, tester 52 is connected to an interface to the internal circuitry of DUT 58. For example, the DUT may be inserted into a socket in the tester, which contains interfaces to electrical connections between the DUT and the tester. A conductor 60 (e.g., one or more conductive pathways) is connected to the interface and is used to deliver test signals (e.g., switching or DC test signals, etc.) to the internal circuitry of DUT 58. Conductor 60 also senses signals in response to the test signals provided by tester 52. For example, a voltage signal or a current signal may be sensed at pin 62 in response to a test signal and sent over conductor 60 to tester 52 for analysis. Such single port tests may also be performed on other pins included in DUT 58. For example, tester 52 may provide test signals to other pins and collect associated signals reflected back over conductors (that deliver the provided signals). By collecting the reflected signals, the input impedance of the pins may be characterized along with other single port testing quantities. In other test scenarios, a digital signal may be sent over conductor 60 to pin 62 for storing a digital value on DUT 58. Once stored, DUT 58 may be accessed to retrieve and send the stored digital value over conductor 60 to tester 52. The retrieved digital value may then be identified to determine if the proper value was stored on DUT 58.

Along with performing single port measurements, a two-port or multi-port test may also be performed by tester 52. For example, a test signal may be injected over conductor 60 into pin 62 and a response signal may be collected from one or more other pins of DUT 58. This response signal may be provided to tester 52 to determine quantities, such as gain response, phase response, and other throughput measurement quantities.

Figure 4:
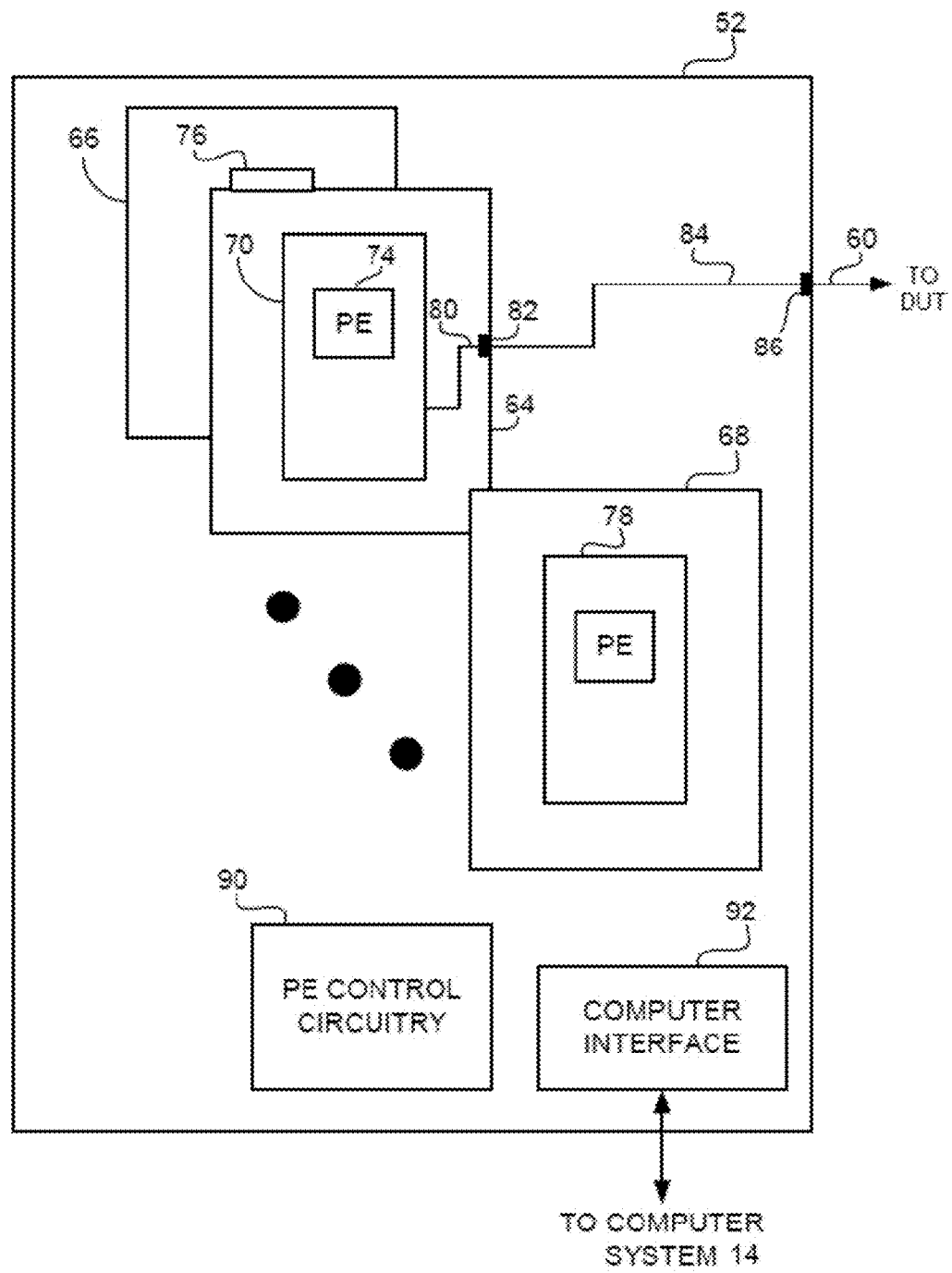
FIG. 4 shows example ATE that includes the test instrument.

Referring also to FIG. 4, to send and collect test signals from multiple connector pins of a DUT (or multiple DUTs), tester 52 includes an interface card 64 that can communicate with numerous pins. For example, interface card 64 may transmit test signals to, e.g., 32, 64, or 528 pins and collect corresponding responses. Each communication link to a pin corresponds to a channel such as that shown in FIG. 2 and, by providing test signals to a number of channels, testing time is reduced since multiple tests may be performed simultaneously. Along with having many channels on an interface card, by including multiple interface cards in tester 52, the overall number of channels increases, thereby further reducing testing time. In this example, two additional interface cards 66 and 68 are shown to demonstrate that multiple interface cards may populate tester 52.

Each interface card includes one or more dedicated integrated circuit (IC) chips (e.g., an application specific integrated circuit (ASIC)) for performing particular test functions. For example, interface card 64 includes IC chip 70 for performing pin electronics (PE) tests. Specifically, IC chip 70 has a PE stage 74 that includes circuitry for performing PE tests. Additionally, interface cards 66 and 68 respectively include IC chips 76 and 78 that include PE circuitry. Typically, PE testing involves sending switching test signals, or digital waveforms, to a DUT (e.g., DUT 58) and collecting responses to further characterize the performance of the DUT. For example, IC chip 70 may transmit (to the DUT) switching test signals that represent a vector of binary values for storage on the DUT. Once these binary values have been stored, the DUT may be accessed by tester 52 to determine if the correct binary values have been stored. Since digital signals typically include abrupt voltage transitions, the circuitry in PE stage 74 on IC chip 70 operates at a relatively high speed in comparison to the other test circuitry (e.g., parametric measurement unit (PMU) circuitry, which is not shown in the figures). PE testing may also involve adding jitter to test signals and observing DUT operation in the presence of the jitter.

In this example implementation, to pass test signals from interface card 64 to DUT 58, one or more conducting traces 80 connect IC chip 70 to an interface board connector 82 that allows signals to be passed on and off interface board 64. Interface board connector 82 is also connected to one or more conductors 84 that are connected to an interface connector 86, which allow signals to be passed to and from tester 52. In this example, conductor(s) 60 are connected to interface connector 86 for bi-directional signal passage between tester 52 and pins of DUT 58. In some implementations, an interface device may be used to connect one or more conductors from tester 52 to the DUT. For example, the DUT (e.g., DUT 58) may be mounted onto a device interface board (DIB) for providing access to each DUT pin. In such an arrangement, conductor(s) 60 may be connected to the DIB for placing test signals on the appropriate pin(s) (e.g., pin 62) of the DUT.

In some implementations, conducting trace(s) 80 and conductor(s) 84 respectively connect IC chip 70 and interface board 64 for delivering and collecting signals. IC chip 70 (along with IC chips 76 and 78) may have multiple pins (e.g., eight, sixteen, etc.) that are respectively connected with multiple conducting traces and corresponding conductors for providing and collecting signals from the DUT (e.g., via a DIB). Additionally, in some implementations, tester 52 may connect to two or more DIB's for interfacing the channels provided by interface cards 64, 66, and 68 to one or multiple devices under test.

To initiate and control the testing performed by interface cards 64, 66, and 68, tester 52, PE control circuitry 90 provides test parameters (e.g., test signal voltage level, test signal current level, digital values, etc.) for producing test signals and analyzing DUT responses. The PE control circuitry may be implemented using one or more processing devices. Examples of processing devices include, but are not limited to, a microprocessor, a microcontroller, programmable logic (e.g., a field-programmable gate array), and/or combination(s) thereof. Tester 52 also includes a computer interface 92 that allows computer system 54 to control the operations executed by tester 52 and also allows data (e.g., test parameters, DUT responses, etc.) to pass between tester 52 and computer system 54.

While this specification describes example implementations related to "testing" and a "test system," the devices and method described herein may be used in any appropriate system, and are not limited to test systems or to the example test systems described herein.

Testing performed as described herein may be implemented using hardware or a combination of hardware and software. For example, a test system like the ones described herein may include various controllers and/or processing devices located at various points. A central computer may coordinate operation among the various controllers or processing devices. The central computer, controllers, and processing devices may execute various software routines to effect control and coordination of testing and calibration.

Testing can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing and calibration can be performed by one or more programmable processors executing one or more computer programs to perform the functions described herein. All or part of the testing and calibration can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass PCBs for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may imply a direct physical connection or a connection that includes intervening components but that nevertheless allows electrical signals to flow between connected components. Any "connection" involving electrical circuitry mentioned herein, unless stated otherwise, is an electrical connection and not necessarily a direct physical connection regardless of whether the word "electrical" is used to modify "connection".

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A method of controlling a test instrument; comprising:
   determining a first value corresponding to power output by the test instrument;
   determining a second value based on the first value, the second value corresponding to an amount of energy consumed by the test instrument; and
   placing at least part of the test instrument in a high-impedance state when the second value exceeds a threshold;
   wherein the test instrument comprises multiple channels; and
   wherein the following are performed for a channel in the test instrument: determining the first value, determining the second value, and placing the test instrument in the high-impedance state.

2. The method of claim 1, wherein determining the first value comprises obtaining a product of an input voltage value and a voltage corresponding to an input current value and, based on the product, producing an output voltage corresponding to the first value.

3. The method of claim 2, wherein determining the second value comprises:
   generating an output current based on the output voltage; and
   integrating the output current over time to produce the second value.

4. The method of claim 3, further comprising:
   comparing the second value to the threshold; and
   outputting a comparison value based on the comparison;
   wherein the test instrument is placed in the high-impedance state by a latch in response to receipt of the comparison value, the latch outputting a control signal to place the test instrument in the high-impedance state.

5. The method of claim 4, wherein the threshold is a first threshold; and
   wherein the method further comprises:
   following placement of the test instrument into the high-impedance state, lowering the power output by the test instrument so that the output current is less than a fixed current;
   performing a reverse integration over time based on the fixed current to produce a third value;
   comparing the third value to a second threshold; and
   placing at least part of the test instrument in an operational state when, based on the comparing, the third value exceeds the second threshold.

6. The method of claim 5, wherein comparing the third value to the second threshold results in a second comparison value; and
   wherein the test instrument is returned to the normal operational state by a resetting of the latch in response to receipt of the second comparison value, the latch outputting a control signal to place the test instrument in the operational state.

7. The method of claim 2, wherein the input voltage is based on a voltage across terminals of a power field-effect transistor; and
   wherein the input current is based on voltage across terminals of a current sense resistor.

8. The method of claim 2, wherein a multiplier circuit is used to determine the first value corresponding to an output voltage;
wherein the output voltage is output to a resistor to produce a current that exceeds a fixed current; and
wherein the second value is obtained by integrating the current over time.

9. The method of claim 1, further comprising:
causing the test instrument to exit the high-impedance state following a decrease in the power output by the test instrument.

10. The method of claim 1, further comprising:
following placing at least part of the test instrument in a high-impedance state, controlling the test instrument manually or programmatically to place the test instrument into an operational state.

11. Circuitry to control a test instrument, comprising:
a multiplier circuit to receive an input voltage and a voltage corresponding to an input current and to provide an output voltage representing power output of the test instrument;
an integrator circuit to output an integrated voltage based on a current corresponding to the output voltage, the integrated voltage representing energy consumed by the test instrument;
a comparator circuit to perform a comparison of the integrated voltage to a threshold, and to output a result signal based on the comparison; and
a latch to output a control signal to the test instrument based on the result signal, the control signal to place at least one of multiple channels of the test instrument in a high-impedance state.

12. The circuitry of claim 11, further comprising:
a resistor to receive the output voltage, the current corresponding to the output voltage passing through the first resistor as a result of the output voltage received by the resistor.

13. The circuitry of claim 12, wherein the resistor is a first resistor, the current corresponding to the output voltage is a first current, the integrated voltage is a first integrated voltage, the threshold is a first threshold, and the control signal is a first control signal; and
wherein the circuitry comprises:
a second resistor connected to a voltage source, a second current passing through the second resistor;
wherein, in a case that the second current is greater than the first current, the integrator circuit is configured to output a second integrated voltage based on the second current;
wherein the comparator circuit is configured to perform a comparison of the second integrated voltage to a second threshold, and to output a second result signal based on the comparison; and
wherein the latch is configured to output a second control signal to the test instrument based on the second result signal.

14. The circuitry of claim 13, wherein the first control signal is to put the at least one of multiple channels of the test instrument into the high-impedance state, and the second control signal is to put the at least part of the test instrument into operational mode.

15. The circuitry of claim 11, further comprising:
a power field-effect transistor across which a voltage corresponding to the input voltage is measured; and
a resistor through which a current corresponding to the input current is measured.

16. The circuitry of claim 11, further comprising:
a power stage to output power from the instrument to a device under test, the power stage being configured to receive, and to respond to, the control signal.

17. The circuitry of claim 11, wherein the integrator circuit comprises an operational amplifier.

18. Circuitry to control a test instrument, comprising:
an integrator circuit to output an integrated voltage based on a current corresponding primarily to an output power of the test instrument when the output power of the test instrument is above a threshold, the integrated voltage representing energy consumed by the test instrument;
a comparator circuit to perform a comparison of the integrated voltage to a threshold, and to output a result signal based on the comparison; and
a latch to output a control signal to the test instrument based on the result signal, the control signal to place at least one of multiple channels of the test instrument in a high-impedance state.

* * * * *